(12) United States Patent
Lopatinsky et al.

(10) Patent No.: US 6,981,542 B2
(45) Date of Patent: Jan. 3, 2006

(54) MULTI-HEATSINK INTEGRATED COOLER

(75) Inventors: Edward Lopatinsky, San Diego, CA (US); Naum Shostak, Los Angeles, CA (US); Lev Fedoseyev, El Cajon, CA (US)

(73) Assignee: Rotys Inc., San Diego, CA (US)

( * ) Notice: Subject to any disclaimer, the term of this patent is extended or adjusted under 35 U.S.C. 154(b) by 29 days.

(21) Appl. No.: 10/696,617

(22) Filed: Oct. 29, 2003

(65) Prior Publication Data

US 2005/0092463 A1   May 5, 2005

(51) Int. Cl.
*F28F 7/00* (2006.01)
(52) U.S. Cl. ..................................... 165/80.3; 165/185
(58) Field of Classification Search ...... 165/80.2–80.5, 165/185, 104.34, 104.33, 104.19, 104.21, 165/104.26
See application file for complete search history.

(56) References Cited

U.S. PATENT DOCUMENTS

| | | | | |
|---|---|---|---|---|
| 2,143,919 | A * | 1/1939 | Kotterman | 165/80.3 |
| 4,851,965 | A * | 7/1989 | Gabuzda et al. | 361/691 |
| 4,884,631 | A * | 12/1989 | Rippel | 165/185 |
| 5,597,034 | A * | 1/1997 | Barker et al. | 165/80.3 |
| 6,359,781 | B1 * | 3/2002 | Hoss et al. | 165/104.33 |
| 6,798,663 | B1 * | 9/2004 | Rubenstein | 361/697 |
| 2001/0009187 | A1 * | 7/2001 | Lin | 165/80.3 |
| 2002/0017378 | A1 * | 2/2002 | Hu | 165/80.3 |
| 2002/0079086 | A1 * | 6/2002 | Huang et al. | 165/80.3 |
| 2002/0088607 | A1 * | 7/2002 | Lo | 165/80.3 |
| 2002/0121365 | A1 * | 9/2002 | Kozyra | 165/185 |
| 2002/0139518 | A1 * | 10/2002 | Lee et al. | 165/80.3 |
| 2002/0162647 | A1 * | 11/2002 | Wagner | 165/80.3 |
| 2004/0124846 | A1 * | 7/2004 | Yamashita et al. | 324/537 |
| 2005/0061477 | A1 * | 3/2005 | Mira | 165/80.3 |
| 2005/0073811 | A1 * | 4/2005 | Wang et al. | 165/80.3 |
| 2005/0145366 | A1 * | 7/2005 | Erel | 165/80.3 |

\* cited by examiner

*Primary Examiner*—Teresa J. Walberg

(57) ABSTRACT

A multi-heatsink integrated cooler for direct cooling of at least two electronic components comprises at least two heatsinks with heat-exchanging means and housings with inflow and outflow openings and one common blower. Each of the heatsinks is located independently in tight contact with one of said electronic components. The housings of all said heatsinks are hydraulically connected in a common system of airflow between said heat-exchanging means of all the heatsinks and the inside space of said blower by at least one sealing element from the elastic material located in the clearance between nearest parts of said housings thus compensating the differences in locations and tolerances. The cooler comprises the radial blower located overlapping at least one of said heatsinks so that an inlet of said blower is coincided with the outflow opening of said common system of airflow. Said blower is located directly on the surface of one of said heatsinks overlapping at least one another heatsink.

8 Claims, 7 Drawing Sheets

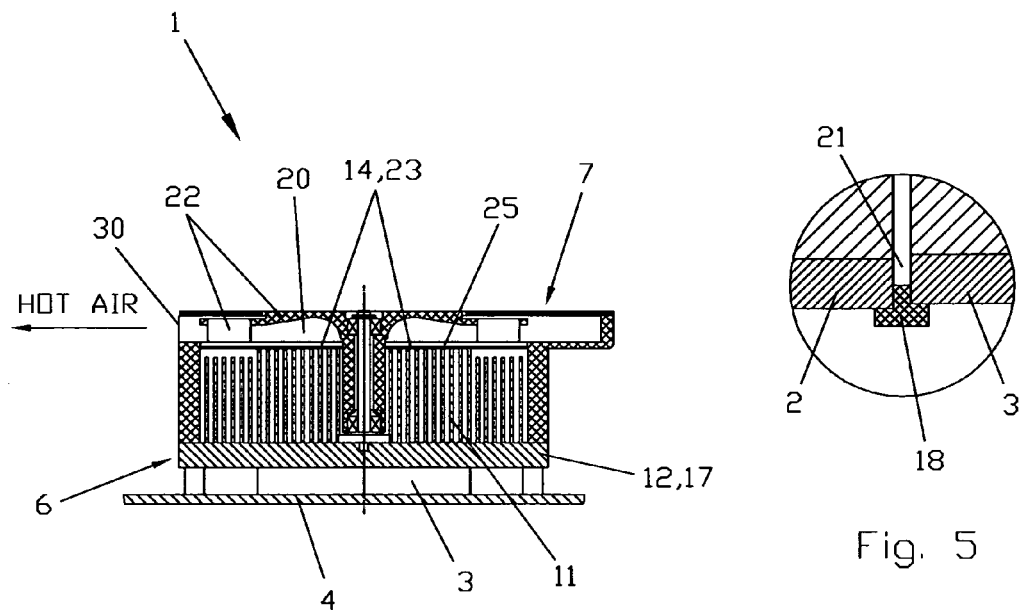
Fig. 4
Fig. 5
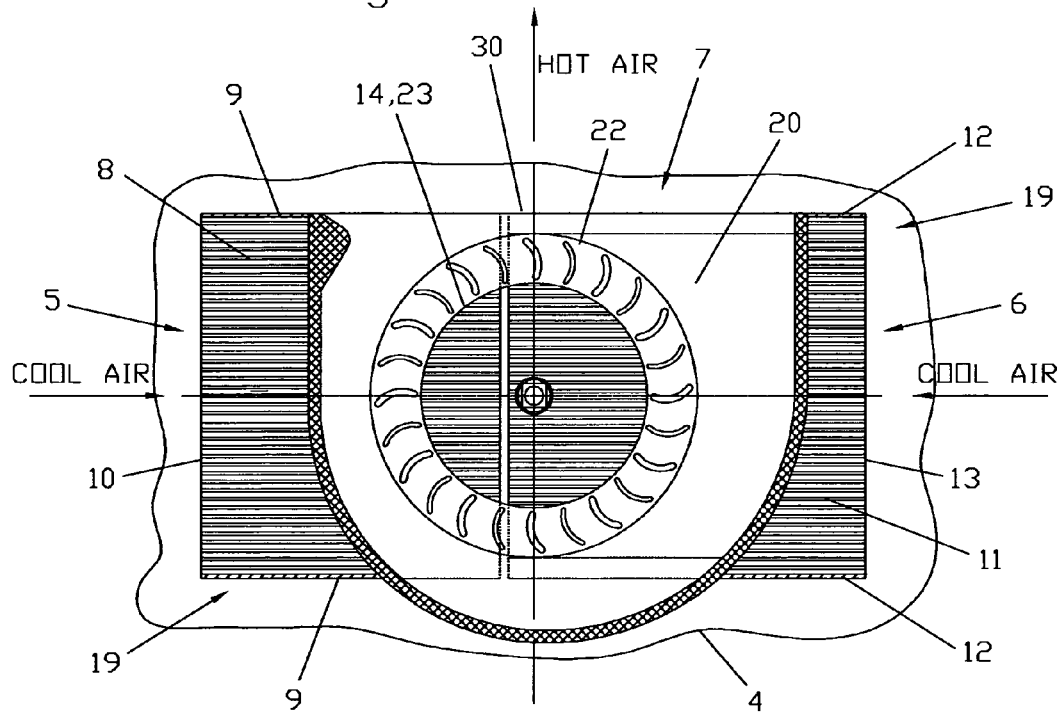
Fig. 6

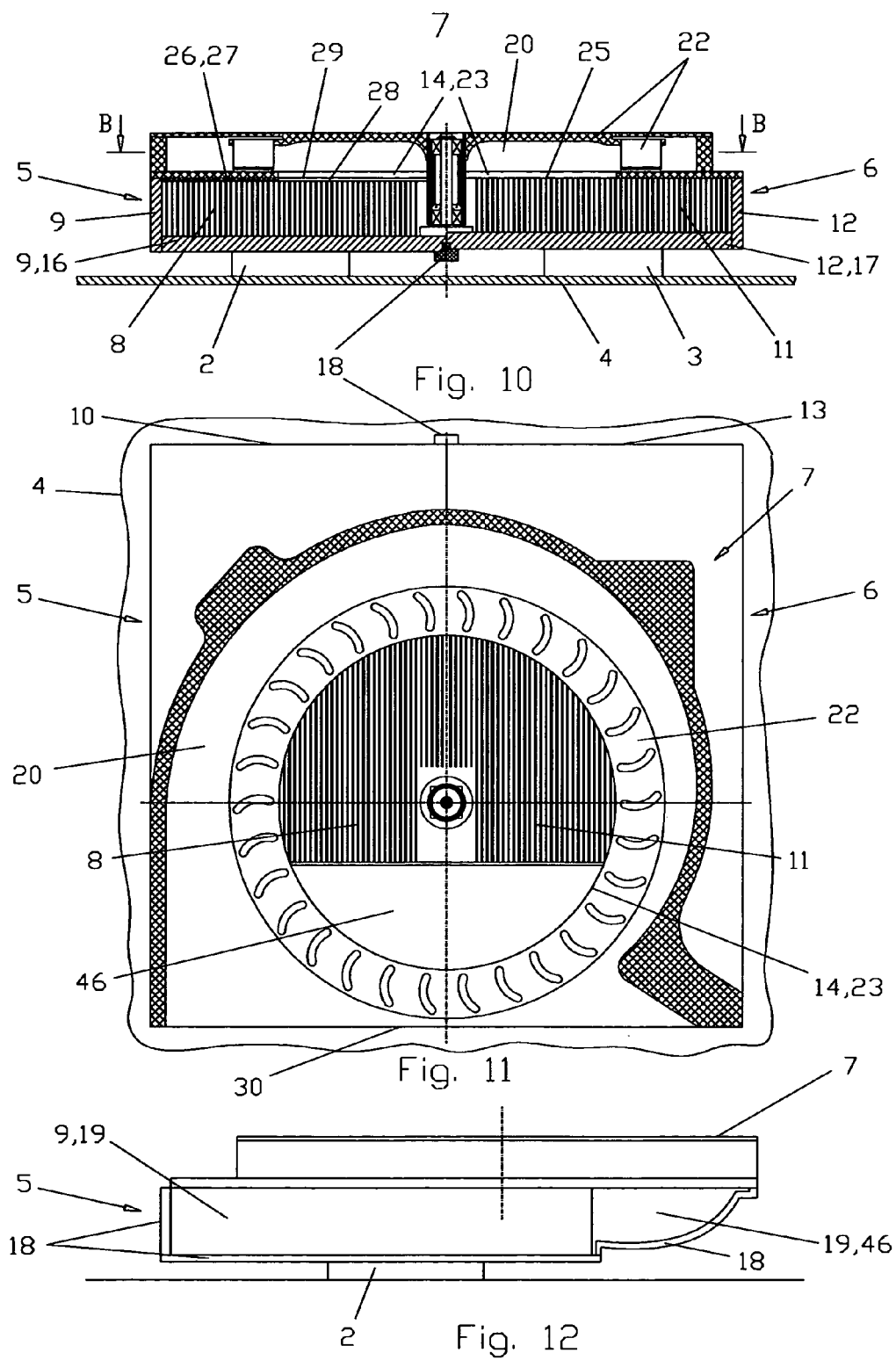

MULTI-HEATSINK INTEGRATED COOLER

BACKGROUND OF THE INVENTION

The present invention relates generally to cooling systems. More particularly, the present invention relates to the coolers for regulating the temperature of electronic devices. The present invention is particularly, but not exclusively, useful for cooling systems that regulate the temperature of electronic components of blade servers.

The regulation of the temperature of electronic components like processors due to heat generated inside the housing of an electronic device like a blade server is an important consideration during the design of an electronic device. Cooling is important because if left unchecked, heat can cause electronic devices to malfunction during use or lead to premature device failure. As improvements in processor speed occur, the amount of heat generated by the faster processors also increases. Additionally, improved processors require larger power supplies and auxiliary components that generate increased amounts of heat and require improved systems for heat removal.

Another factor that aggravates the need for improved heat removal cooling systems is the trend towards making computing devices such as blade servers smaller and especially thinner. The trend toward smaller and thinner electronic devices having larger, faster processors renders the traditional heat removal cooling systems inadequate for several reasons. First, smaller devices having faster processors result in an increased density of heat producing by electronic components leading to higher concentrations of heat. Second, a decreased amount of space is available for temperature regulating devices such as traditional heatsinks. Lastly, a decreased amount of space is available to create ventilation paths that pass through the heat-exchanging channels of the heatsink. Thus, traditional cooling systems with blower assembly having one blower with an inlet that ventilates the entire housing of the device and, accordingly, all electronic components are less effective or inapplicable in removing heat when used in smaller, thinner devices.

There are numerous designs of the coolers for direct cooling of electronic components (described, for example, in the patent of Japan No 8-195,456 "Cooler for electronic apparatus", in the U.S. Pat. No. 5,838,066 "Miniaturized cooling fan type heatsink for semiconductor device", on the website http://www.dynatron-corp.com/products/cpucooler/1USolution.asp? page=1U, —DC1U-B04) that include the number of cooling assemblies equal to the number of cooling electronic components of the electronic device, so each of said cooler assemblies comprises a heatsink located in the tight contact with the surface of the electronic component and a blower located in the contact with said heatsink. These conventional coolers had been using axial or radial blowers primarily. The radial blower produces an airflow that passes by the heat-exchanging channels and then through the inlet, the impeller and the outlet of said blower to the ambient air.

These cooling systems provide good heat removal. But they are expensive, need a high amount of material, have big overall sizes and not enough high efficiency because of having number of blowers equal to the number of cooling electronic components.

There are numerous designs of the coolers for cooling of electronic components (integrated circuit chips) that include one common heatsink installed in the contact with all or several (at least two) of the electronic components of the electronic device. These coolers have usually one common blower.

The heatsink of such cooler should have tight contact with the surfaces of all said electronic components. But it is difficult to insure that every electronic component will be coupled to the heatsink evenly because of dimensional tolerances from one electronic component (chip) to another. Some of them may not even be coupled at all to the heatsink, while excessive mechanical stress may be imparted to the others.

There have been proposed a number of solutions in the past to these problems. One such solution, described in U.S. Pat. No. 4,235,283 "Multi-stud thermal conduction module" and in IBM Technical Disclosure Bulletin, vol. 24, no. 11A, April 1982, pages 5625, 5626, and in vol. 28, no. 5, October 1985, pages 2237–2238, employs captive pistons or other elements with springs within the heatsink to contact the chips and accommodate variances in the mechanical features and tolerances. This technique is mechanically complex and therefore costly.

Other technique, also described in said IBM Bulletin and in U.S. Pat. No. 5,981,310 "Multi-chip heat-sink cap assembly", employs the use of thermally conductive material as solder or a thixotropic thermal compound to fill the gaps between the electronic components and the heatsink. This technique is difficult to implement, and it does not gives good enough contact between the heatsinks and electronic components.

It is known solution described in U.S. Pat. No. 5,184,211 "Apparatus for packaging and cooling integrated circuit chips" employs cushions from elastic material between each of the electronic components and the heatsink.

This solution and all other solutions with one common heatsink for several electronic components have one common deficiency—they cannot provide a good tight contact with low thermal resistance (without air bubbles) between the heatsinks and electronic components compared to the heatsinks that are individually installed on each electronic component. So they are not efficient enough. As a result of not enough good contact and of having one common heatsink in the contact with several of the electronic components, these coolers use a lot of energy, has large overall sizes and is expensive because of comprising of big amount of material and parts.

It would be generally desirable to provide a cooler that overcomes this problem and has higher thermal efficiency at smaller sizes.

SUMMARY OF THE INVENTION

According to the present invention this goal is achieved by a multi-heatsink integrated cooler for direct cooling of at least two electronic components comprising at least two heatsinks with heat-exchanging means and housings with inflow and outflow openings and one common blower. Each of said heatsinks is located independently in tight contact with one of said electronic components. Said housings of all said heatsinks are connected in a common system of airflow between said heat-exchanging means of all the heatsinks and the inside space of said blower.

The general idea of the claimed invention is to achieve maximum efficient cooling by providing the tight contact between the heatsinks system and at least two electronic components blowing air through all these heatsinks by one common blower. It is guaranteed by said combination of the features. Several heatsinks each of which is located independently and directly on one of said electronic components and hydraulic connection of the housings of all said heatsinks in a common system of airflow allows the possibility to provide tight contact with the heatsink system for each of the electronic components and to blow all air through the heatsinks with only one common blower. As a result this cooler has much higher efficiency than all known coolers and a smaller size because of using one blower.

But it is very difficult usually to form said common airflow system from said housings because of differences of locations, mechanical features and tolerances from one electronic component to another and because of differences in mechanical features and tolerances of said housings. There are usually sufficient differences between the locations of the electronic components (their surfaces are located usually in different heights and with different tilts) and, as a result, between the locations of said housings, so it is impossible to connect said housings directly one to another without clearances between them, for example, by welding. In order to overcome this problem and to create the possibility to form one common airflow from all said housings of the heatsinks, accordingly to the present invention, said housings of the heatsinks are connected by at least one intermediate sealing element from the elastic material located in the clearance between nearest parts of said housings thus compensating the differences in locations and tolerances.

According to the further embodiment said cooler comprises a radial blower located overlapping at least one of said heatsinks so that an inlet of said blower is coincided with the outflow opening of said common system of airflow. Using the radial blower in this case (with a system of several heatsinks) is the best variant for lowering the amount of used energy.

According to the further embodiment said blower is located directly on the surface of one of said heatsinks overlapping with at least one another heatsink so that an axis of rotation of its impeller is perpendicular to the surfaces of said heatsinks. Using the surface of the heatsink as a base for the blower provides good contact between the casing of the blower and at least one of the heatsinks without sealing element and resulting in a saving of material.

According to the further embodiment said blower is located overhanging the area with said heat-exchanging means of the heatsinks so that at least 10% of the area of its inlet is located above the area of said common system of airflow without said heat-exchanging means. The best variant is when 25–45% of the area of said inlet is located above the area without said heat-exchanging means. In this case there is more even distribution of airflow through heat-exchanging means and the lower hydraulic resistance that additionally increases the efficiency of the cooler.

The variant when said blower is located in a recess made in said common system of airflow guarantees the minimal height of the cooler that usually is very important.

According to the further embodiment said cooler further comprises at least one sealing element from the elastic material located in the clearance between surfaces of said heatsink (heatsinks) and said blower facing each other in contact with both said surfaces in at least part of said overlapping area so that all said clearances are sealed. Together with said sealed elements between the housings of the heatsinks it protects the airflow system from the leaking of air, compensating in this case the differences in locations and tolerances between the surfaces of the heatsinks and the blower. The variant when said sealing element (elements) is made from the thermal-conducting material and is in the thermal contact with heat-exchanging means of said heatsink so it serves as heat-exchanging element allowing additional increase in the thermal efficiency of the cooler.

BRIEF DESCRIPTION OF THE SEVERAL VIEWS OF THE DRAWINGS

FIG. 4 is a cross-section view by section C—C on FIG. 2 showing the first embodiment of said cooler.

FIG. 5 is a part A of the cooler in FIG. 2 shown in larger scale,—it shows one of the sealing elements which form with the housings of the heatsink the common system of the airflow and is common for all embodiments of said cooler.

FIG. 6 is a cross-section view by section B—B on FIG. 2 showing the first embodiment of said cooler.

FIG. 10 is a cross-section view showing the third embodiment of this cooler, section by axis of rotation of the blower crossing heat-exchanging means (the blower is located not in recess and overhanging the heat-exchanging means).

FIG. 11 is a cross-section view by section C—C on FIG. 10 of the third embodiment.

FIG. 12 is an elevation view from the left side on FIG. 11 of the third embodiment.

DETAILED DESCRIPTION OF THE INVENTION

Figure 1:
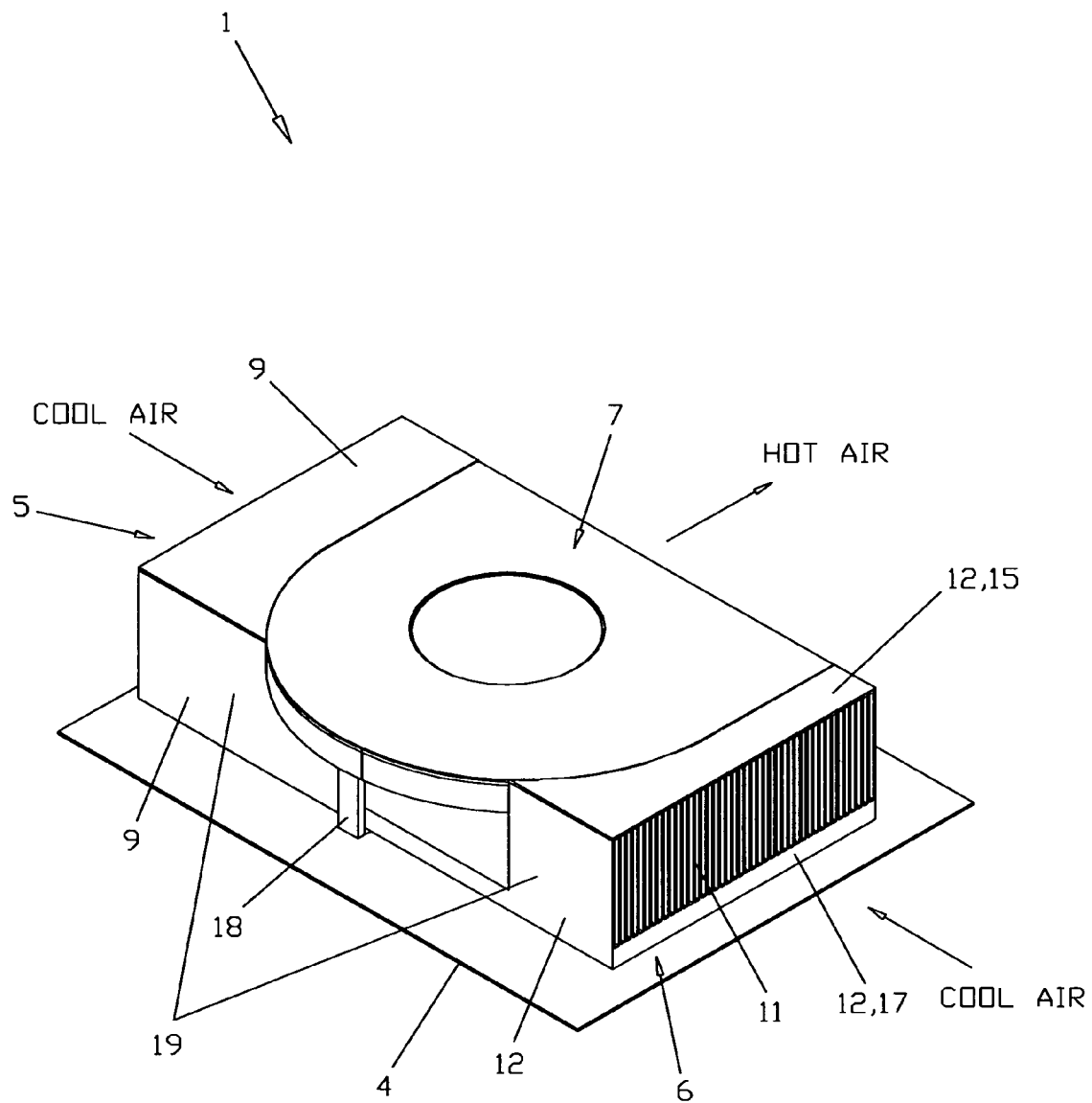
FIG. 1 is a perspective view showing the first embodiment of the multi-heatsink integrated cooler for electronic components by the present invention (two heatsinks, the blower in the recess).
Figure 2:
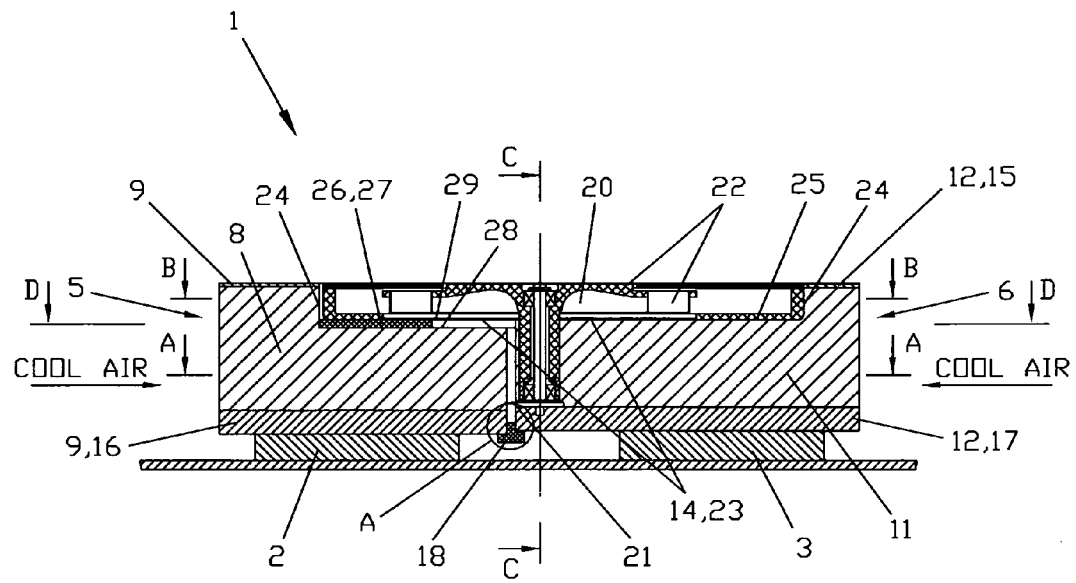
FIG. 2 is a cross-section view showing this cooler, section by axis of rotation of the blower.
Figure 3:
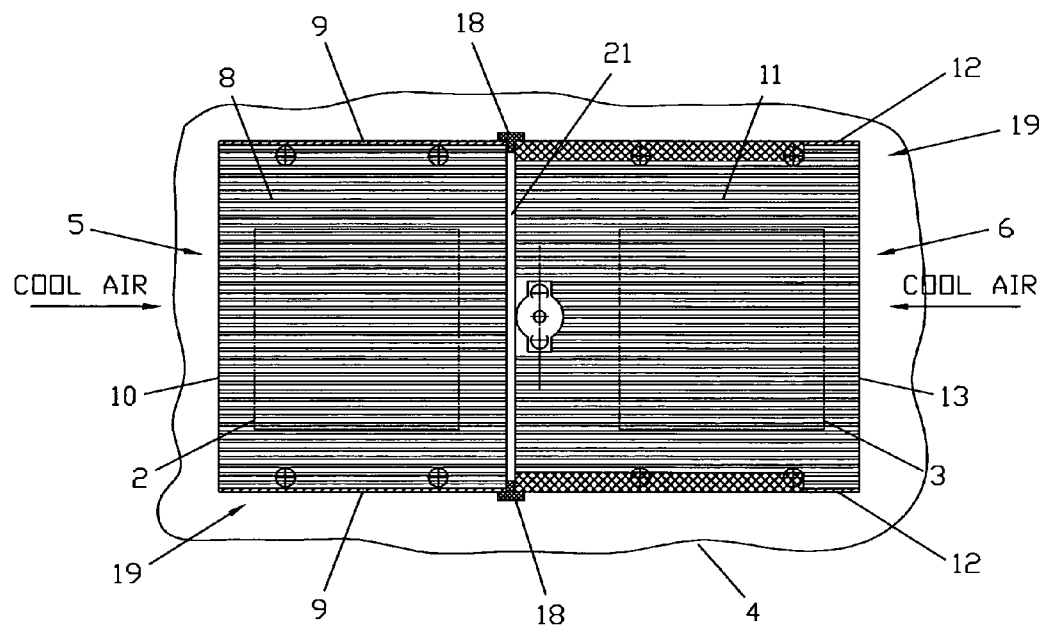
FIG. 3 is a cross-section view by section A—A on FIG. 2 showing the first embodiment of said cooler.

Claimed invention will be described in detail below with reference to the accompanying drawings on FIGS. 1–12.

In the first embodiment (FIGS. 1–6) a multi-heatsink integrated cooler 1 for direct cooling of two electronic components 2 and 3 located on a common horizontal board 4 comprises two heatsinks 5 and 6 and one common radial blower 7. The heatsink 5 comprises heat-exchanging means 8 and a housing 9 with an inflow opening 10. The heatsink 6 comprises heat-exchanging means 11 and a housing 12 with an inflow opening 13 and an outflow opening 14 located in the upper part 15 of the housing 12. The heat-exchanging means 8 and 11 are made as fins. Each of said heatsinks 5 and 6 is located independently in tight contact with one of said electronic components 2 and 3,—the heatsink 5 on the electronic component 2 and the heatsink 6 on the electronic component 3, so the lower part (providing thermal contact base) 16 of the housing 9 of the heatsink 5 is in tight contact with the electronic component 2 and the lower part (the providing thermal contact base) 17 of the housing 12 of the heatsink 6 is in the tight contact with the electronic component 3. The housings 9 and 12 of said heatsinks 5 and 6 are hydraulically connected by the sealing element 18 from the elastic material in a common system of airflow 19 between the heat-exchanging means 8 and 11 of said heatsinks and the inside space 20 of the blower 7 so that the outflow opening 14 of the heatsink 6 serves as outflow opening for the common system of airflow 19 formed by the housings 9 and 12 of the heatsinks 5 and 6. Said sealing element 18 from the elastic material is located in the clearance 21 between the nearest parts of the housings 9 and 12 thus compensating the differences in locations and tolerances of said housings.

The blower 7 comprises a radial impeller 22 and is located overlapping with the heatsinks 5 and 6 so that an inlet 23 of said blower is coincided with the outflow opening 14 of the common system of airflow 19. In this variant an inlet 23 of said blower 7 is not only coincided with the outflow opening 14 of the common system of airflow 19 but said inlet 23 forms the outflow opening 14 or, in other words, it serves at the same time as the outflow opening 14 of the common system of airflow 19. Said blower 7 is located not only overlapping with heatsinks 6 and 7 but also in a recess 24 made in said common system of airflow 19 on the upper side of it directly on a surface 25 of said recessed part of the heatsink 6. Said surface 25 is formed by heat-exchanging means 11 of the heatsink 6. So the surface 25 of the heatsink 6 serves as base for the blower 7 that prevents the leaking of the air between them. The cooler 1 comprises a sealing element 26 located in a clearance 27 between surfaces 28 of the heatsink (heatsinks) 5 and 29 of said blower 7 facing each other in the contact with both said surfaces 28 and 29 in said overlapping area so that said clearance 27 is sealed. The best variant in this case is when said sealing element 26 is made not only from the elastic material but when it is made at the same time from the thermal-conducting material, for example, from the rubber with aluminum or copper powder inclusions, and is in thermal contact with heat-exchanging means 8 of said heatsink 5 so it not only seals the clearance 27 compensating the difference between locations of the recessed surfaces 25 of the heatsink 6 and 28 of the heatsink 5 but it also serves as heat-exchanging element. The axis of rotation (not shown) of the impeller 22 is perpendicular to the surfaces 25 and 28 of the recessed parts of the heatsinks 6 and 5. The blower 7 has outlet 30.

Figure 7:
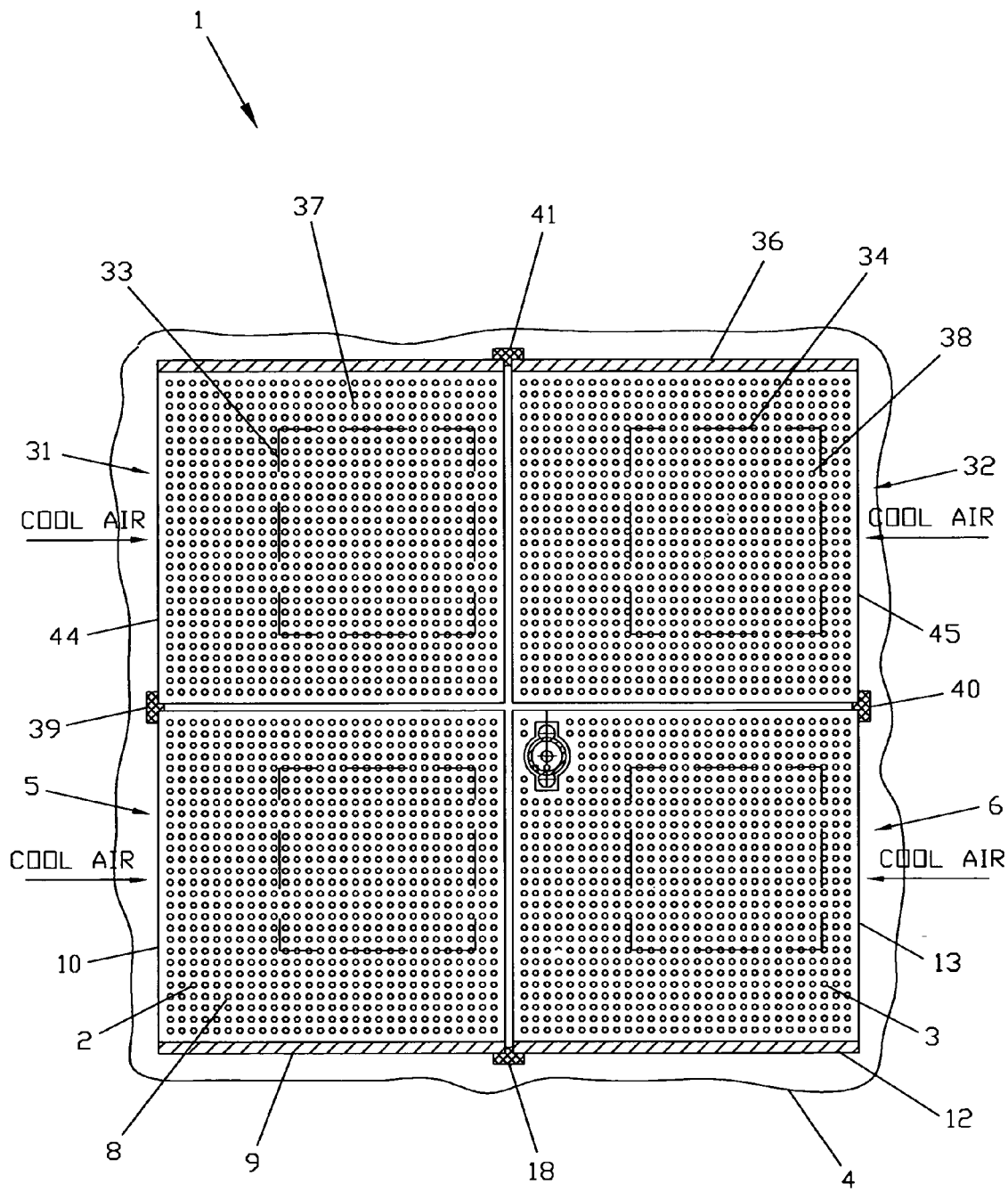
FIG. 7 is a cross-section view by section A—A on FIG. 2 showing the second embodiment of said cooler (with four heatsinks).
Figure 8:
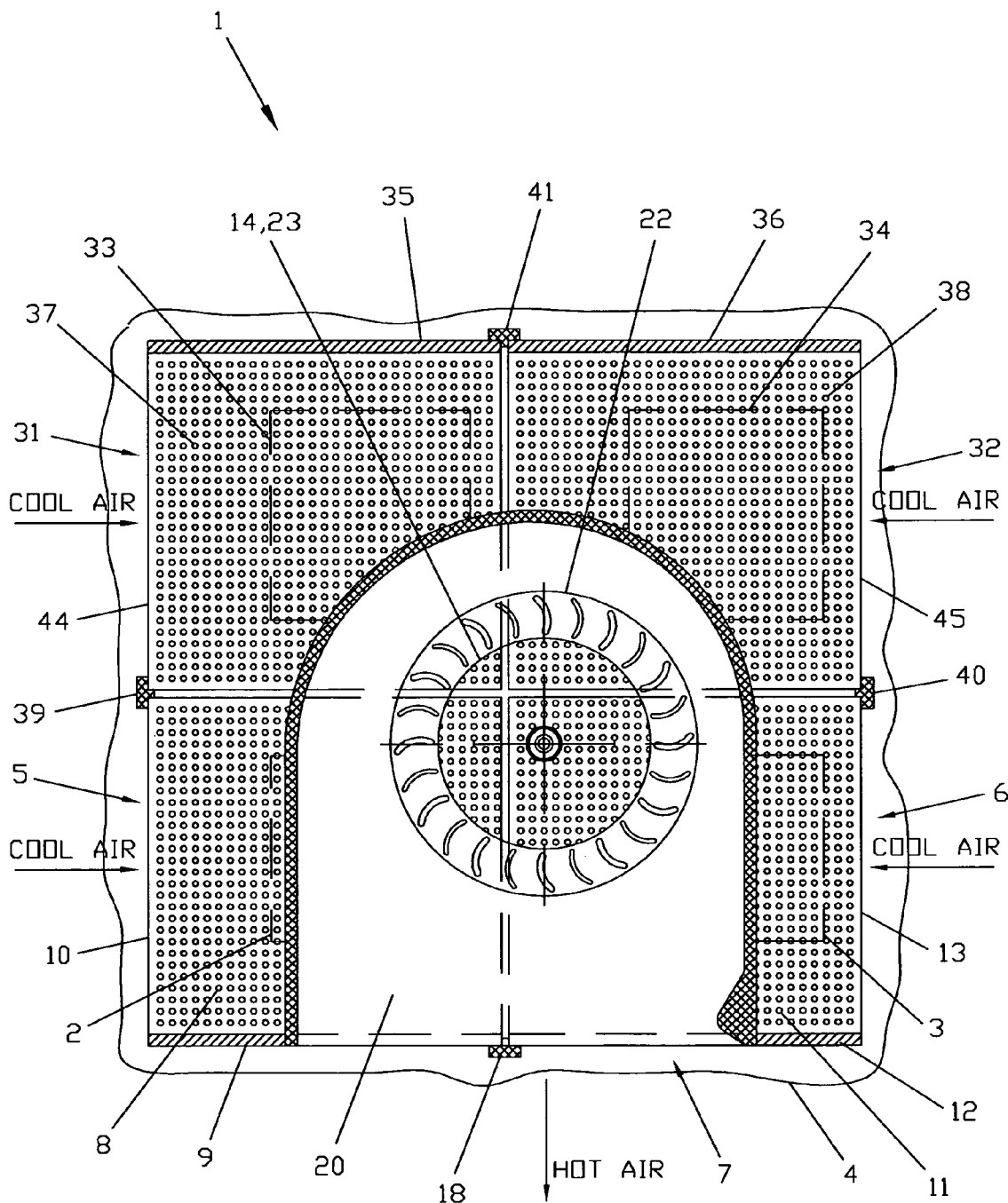
FIG. 8 is a cross-section view by section B—B. on FIG. 2 of the second embodiment.
Figure 9:
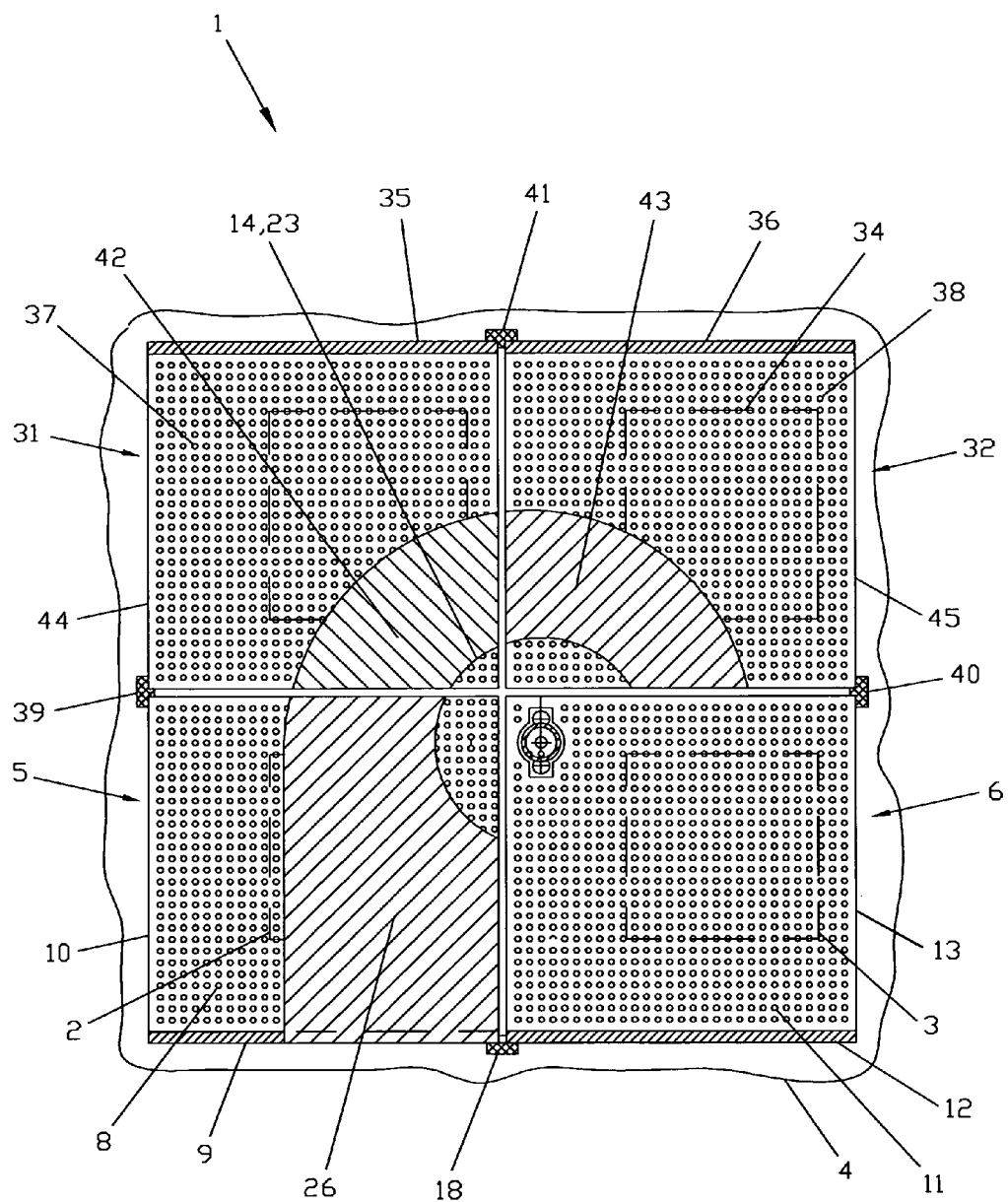
FIG. 9 is a cross-section view by section D—D on FIG. 2 of the second embodiment.

In the FIGS. 7–9 is shown the variant of the multi-heatsinks integrated cooler 1 different from the described variant only because it comprises four heatsinks instead of two,—it has two additional heatsinks 31 and 32 located in tight contact with two additional electronic components 33 and 34 located on the same common horizontal board 4. In this case said common system of airflow 19 is formed by said housings 9 and 12 and by housings 35 and 36 of the heatsinks 31 and 32 accordingly between the heat-exchanging means 8, 11, 37, and 38 of all said heatsinks and the inside space 20 of the blower 7. The housings 9, 12, 35, and 36 are hydraulically connected in the common system of airflow 19 by the sealing compensating elements 18, 39, 40, and 41 from the elastic material. The radial blower 7 is located directly on the surface 25 of said recessed part of the heatsink 6 overlapping with the heatsinks 5, 31 and 32. The cooler 1 comprises sealing elements 26, 42 (between the upper surface of the heatsink 31 and the blower) and 43 (between the upper surface of the heatsink 32 and the blower 7). The heat-exchanging means 8, 11, 37, and 38 of all said heatsinks are made as pins for decreasing the resistance to airflow without the increasing of the labor input,—because in this case the airflow has the air going in a direction that is not parallel to the housings of the heatsinks. The housings 35 and 36 have the inflow openings 44 and 45 accordingly.

In the FIGS. 10–11 is shown the variant of the multi-heatsinks integrated cooler 1 different from the described first variant with two heatsinks because the blower 7 is located overhanging the area with heat-exchanging means 8 and 11 of the heatsinks 5 and 6 so that 35% of the area of its inlet 23 is located above the area 46 of said common system of airflow 19 without said heat-exchanging means 8 and 11. And in this shown variant the blower 7 is partially located above said heatsinks 5 and 6 (not in recess).

The multi-heatsinks integrated cooler 1 for direct cooling of at least two electronic components operates in the following way. When electric power is supplied to the electric drive of the radial impeller 5 of the blower 7 cooling gas starts moving and flows from inflow openings 10 and 13 (or 10, 13, 44, and 45 in the second variant shown on FIGS. 6–8) through heat-exchanging means 8 and 11 (or 8, 11, 37, and 38) of the heatsinks 5 and 6 (or 5, 6, 31, and 32) to the common outflow opening 14 of the common system of airflow 19 formed by the housings 9 and 12 (or 9, 12, 35, and 36) of said heatsinks, the inlet 23 of the blower 7, the inside space 20 of the blower 7 and to the ambient air (by outlet 30 of the blower 7) in a series way. Heat generated by electronic components 2 and 3 (or 2, 3, 33, and 34) transfers to the lower parts (bases) of the housings 9 and 12 (or 9, 12, 35, and 36) due their thermal contact and spread to the heat-exchanging means 8 and 11 (or 8, 11, 37, and 38). As cooling gas flows through said heat-exchanging means the intensive process of heat exchange takes place.

So this cooler has at least two heatsinks (in our example 5 and 6, or four heatsinks 5, 6, 31, and 32) each of which is located independently on one of said electronic components (2 and 3, or 2, 3, 33, and 34) in the tight contact between the heatsinks and said electronic components. All known cooling systems with this type of contact require the number of blowers equal the number of heatsinks. As a result these coolers are expensive, need a high amount of material, have big overall sizes and consume a high amount of energy. All known coolers with one common heatsink and one blower have even lower efficiency than said cooler with many heatsinks and blowers because they cannot provide good enough tight contact between each of the electronic components and the heatsink. In our case accordingly to the present invention connection of the housings (9 and 12, or 9, 12, 35, and 36) of all the heatsinks, each of which is located independently in the tight contact with electronic component, in a common system of airflow (19) gives the possibility to provide the best thermal contact between electronic components and the heatsinks and at the same time the blowing of all the heatsinks with only one common blower (7). Said connection of the housings of the heatsinks by the intermediate sealing elements from the elastic material (18, or 18, 39, 40, and 41) located in the clearances between nearest parts of said housings thus compensating the differences in locations and tolerances allowing a way for connecting of said housings in one common system. Using of the radial type of blower (7) and their location overlapping the heatsinks (5 and 6, or 5, 6, 31, and 32) so that an inlet 23 of said blower is coincided with the outflow opening 14 of the common system of airflow 19 additionally increases the efficiency of the cooler and lowers the amount of using energy accordingly.

As a result this cooler has higher efficiency than all known coolers and a smaller size. It takes less energy and needs less material.

We claim:

1. A multi-heatsink integrated cooler for direct cooling of at least two electronic components comprising at least two heatsinks with heat-exchanging means and housings with inflow and outflow openings and one common blower, wherein:

(i) each of said heatsinks is located independently in tight contact with the surface of one of said electronic components;
(ii) said housings of all said heatsinks are hydraulically connected in a common system of airflow between said heat-exchanging means of all the heatsinks and the inside space of said blower;
(iii) said housings of the heatsinks are connected by at least one sealing element from the elastic material located in the clearance between nearest parts of said housings thus compensating the differences in locations and tolerances.

2. The cooler as claimed in claim 1 further comprising the radial blower located overlapping at least one of said heatsinks so that an inlet of said blower is coincided with the outflow opening of said common system of airflow.

3. The cooler as claimed in claim 2, wherein said blower is located directly on the surface of one of said heatsinks overlapping at least one another heatsink so that an axis of rotation of its impeller is perpendicular to the surfaces of said heatsinks.

4. The cooler as claimed in claim 2, wherein said blower is located in a recess made in said common system of airflow.

5. The cooler as claimed in claim 2, wherein said blower is located overhanging the area with said heat-exchanging means of the heatsinks so that at least 10% of the area of its inlet is located above the area of said common system of airflow without said heat-exchanging means.

6. The cooler as claimed in claim 5, wherein 25–45% of the area of said inlet is located above the area without said heat-exchanging means.

7. The cooler as claimed in claim 2, wherein said cooler further comprises at least one sealing element from the elastic material located in the clearance between the surfaces of said heatsink (heatsinks) and said blower facing each other in contact with both said surfaces in at least part of said overlapping area so that all said clearances are sealed.

8. The cooler as claimed in claim 7, wherein said sealing element (elements) is made from the thermal-conducting material and is in thermal contact with heat-exchanging means of said heatsink so it serves as heat-exchanging element.

* * * * *